United States Patent [19]
Choi

[11] Patent Number: 5,384,469
[45] Date of Patent: Jan. 24, 1995

[54] VOLTAGE-TUNABLE, MULTICOLOR INFRARED DETECTORS

[75] Inventor: Kwong-Kit Choi, Tinton Falls, N.J.

[73] Assignee: The United States of America as represented by the Secretary of the Army, Washington, D.C.

[21] Appl. No.: 79,793

[22] Filed: Jul. 21, 1993

[51] Int. Cl.$^6$ .................................... H01L 31/06
[52] U.S. Cl. .............................. 257/21; 257/17; 257/184; 257/189
[58] Field of Search ............... 257/184, 21, 17, 189

[56] References Cited

U.S. PATENT DOCUMENTS

| | | | |
|---|---|---|---|
| 4,878,104 | 10/1989 | Reed et al. | 257/21 |
| 5,031,013 | 7/1991 | Choi | 257/21 |
| 5,185,647 | 2/1993 | Vasquez | 257/21 |
| 5,198,659 | 3/1993 | Smith et al. | 257/17 |
| 5,216,261 | 6/1993 | Inata | 257/21 |
| 5,239,186 | 8/1993 | McIver et al. | 257/21 |

Primary Examiner—Jerome Jackson
Attorney, Agent, or Firm—Michael Zelenka; William H. Anderson

[57] ABSTRACT

A tunable radiation detector comprises a superlattice structure having a plurality of quantum well units each separated by a first potential barrier and each having at least two doped quantum wells separated by a second potential barrier. The wells each have a lower energy level and a higher energy level. The first potential barriers substantially impede electrons at the lower levels from tunneling therethrough. The second potential barriers permit electrons at the lower levels to tunnel therethrough and prevent energy-level coupling between adjacent ones of the doped quantum wells. A biasing circuit is connected across the semiconductor superlattice structure. A photocurrent sensor is provided for measuring the amount of radiation absorbed by the semiconductor superlattice structure. The superlattice structure is made a part of a hot-electron transistor for providing amplification.

15 Claims, 5 Drawing Sheets

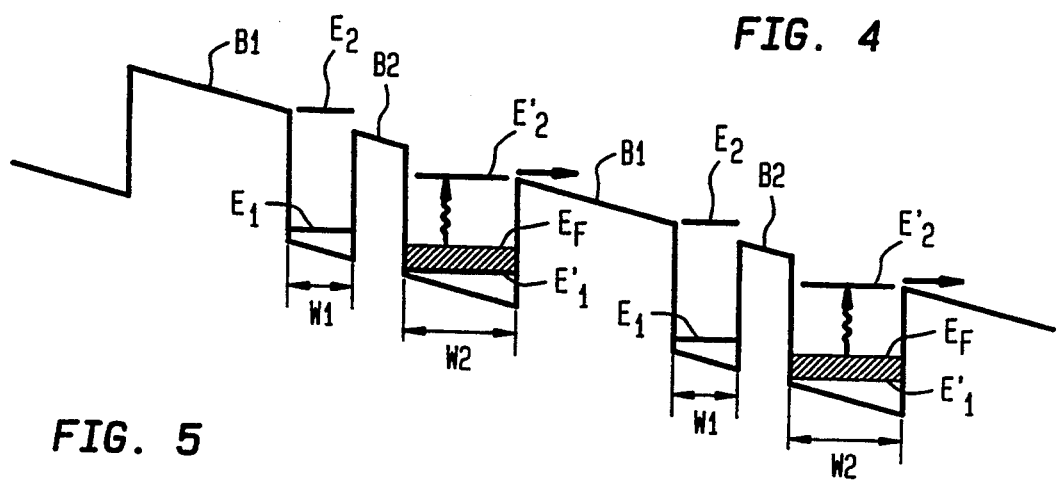
FIG. 4
FIG. 5
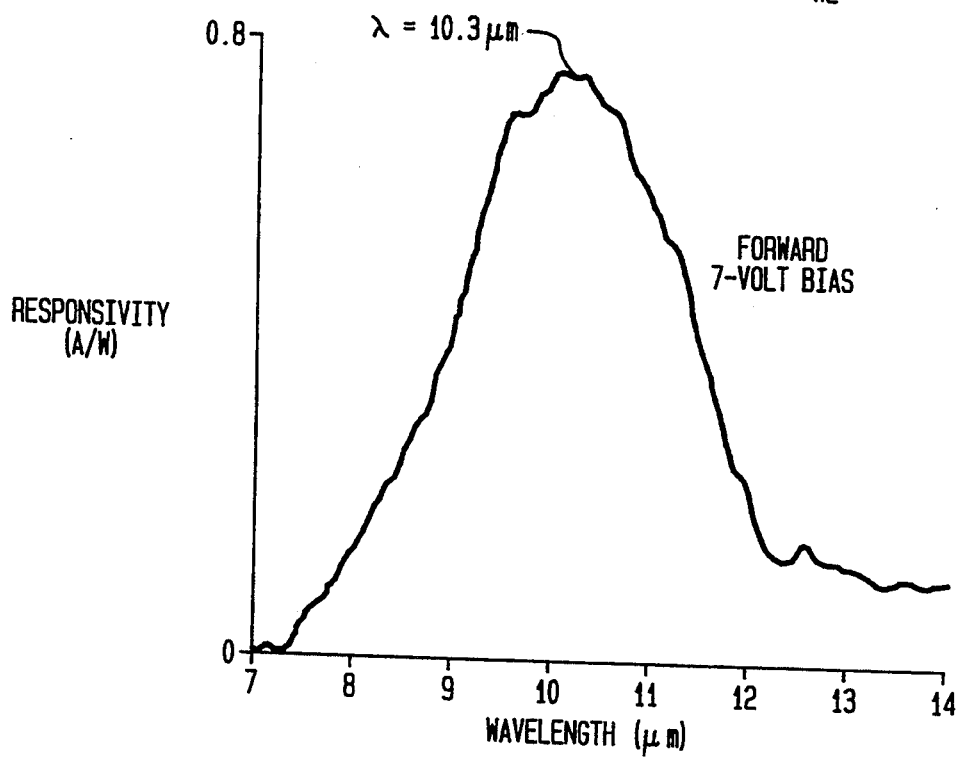
FIG. 6
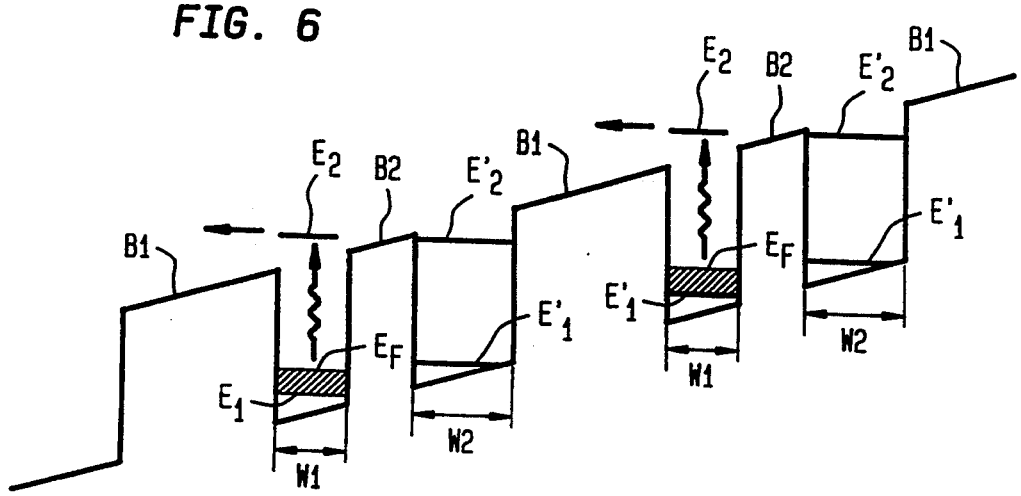

VOLTAGE-TUNABLE, MULTICOLOR INFRARED DETECTORS

GOVERNMENT INTEREST

The invention described herein may be manufactured, used and licensed by or for the Government of the United States of America for governmental purposes without the payment to me of any royalties thereon.

BACKGROUND OF THE INVENTION

1. Field of the Invention

This invention relates to the field of infrared (IR) photodetection. More particularly, the invention relates to semiconductor IR detectors that are capable of being tuned by an applied bias for multicolor detection.

2. Description of the Prior Art

The use of layering semiconductor materials to form a superlattice heterostructure to act as a photodetector is known. U.S. Pat. No. 4,894,526 issued to Bethea et al on Jan. 16, 1990 and entitled, "Infrared-Radiation Detector Device," discloses a narrow-bandwidth, high-speed IR detector that is based on tunneling of photoexcited electrons out of quantum wells. Such photodetectors have also been designed for wide-band operation. Examples of wide-band IR detectors are disclosed in U.S. Pat. No. 5,013,918 issued to Choi on May 7, 1991 and entitled, "Multi-Color Infrared Photodetector," and my U.S. patent application Ser. No. 867,726, filed Mar. 23, 1992 and entitled, "Wide-Range Multicolor IR Detector," both of which are incorporated herein by reference.

Further, the use of these wide-band IR detectors for multicolor detection is also known. One existing multicolor IR detection system comprises a wide-band IR detector and a rotating mechanical multicolor filter wheel. The wide-band-detector detects any wavelength of IR radiation falling on the detector. The rotating filter wheel selects the desired wavelength to pass through and illuminate the detector. Although this system has served the purpose, it has not proved entirely satisfactory for a number of reasons. These systems have been found to be bulky, heavy, slow and subject to mechanical failure. Additionally, because some incident IR is filtered out, these systems are usually insensitive.

For IR detection technology to find widespread commercial and military applications many of these problems must be overcome. For example, to be more acceptable, IR aircraft guidance systems must be able to see through clouds better in different weather conditions. It is known that optimum IR detection wavelengths depend on weather conditions. Specifically, different humidity levels attenuate IR radiation of different wavelengths to a different degree. As such, a multicolor IR detector that can easily switch to different detection wavelengths would be highly useful in this area.

A multicolor IR detector in a satellite survey system provides much useful information about the Earth's natural resources. Different minerals and vegetation reflect IR radiation of different wavelengths to a different degree. Multicolor IR photos of such natural resources may be used to identify the quantities and species of target materials, analogous to viewing the various colors of different objects under visible light.

In like manner, a multicolor IR detector can provide useful information on geographical surveys. For instance, manmade structures appear more prominently in a natural landscape when a two-color detector is used. Also, the temperature of the ocean can be measured more accurately with a multicolor IR detector.

Multicolor IR detector systems have great potential use as medical diagnostic tools, making better thermal images of a human body than other like systems. In summary, multicolor IR detectors find important uses in the following fields: aircraft, mining, agriculture, aerospace, fishing and medical.

SUMMARY OF THE INVENTION

The general purpose of this invention is to provide a multicolor IR detector which embraces all the advantages of similarly employed prior art devices and possesses none of the aforedescribed disadvantages. To attain this, the present invention contemplates a unique tunable IR multicolor detector.

Broadly, the present invention is directed to a semiconductor superlattice structure that enables the detection wavelength (color) of a radiation detector to be changed by changing an applied bias. The semiconductor superlattice structure comprises a plurality of quantum well units with each unit having at least two doped quantum wells. Each doped quantum well has a lower energy level and a higher energy level. First potential barriers are located between the quantum well units. The first potential barriers substantially impede the tunneling of electrons located at the lower energy levels. Second potential barriers are located between the doped quantum wells in each of the quantum well units. The second potential barriers permit electrons at the lower levels to tunnel therethrough and prevent energy-level coupling between adjacent ones of the doped quantum wells so that the energy levels in one well are not effected by the presence of the levels in an adjacent well.

In accordance with another aspect of the invention, a tunable radiation detector comprises a semiconductor superlattice structure having a plurality of quantum well units each separated by a first potential barrier and each having at least two doped quantum wells separated by a second potential barrier. The wells each have a lower energy level and a higher energy level. The first potential barriers substantially impede electrons at the lower levels from tunneling therethrough. The second potential barriers permit electrons at the lower levels to tunnel therethrough and prevent energy-level coupling between adjacent ones of the doped quantum wells. A biasing circuit is connected across the semiconductor superlattice structure. A photocurrent sensor is provided for measuring the amount of radiation absorbed by the semiconductor superlattice structure.

The exact nature of this invention as well as other objects and advantages thereof will be readily apparent from consideration of the following specification relating to the annexed drawing.

BRIEF DESCRIPTION OF THE DRAWINGS

FIG. 4 is a schematic conduction band potential profile illustrating the preferred embodiment of FIG. 1 under a forward applied bias.

FIG. 5 is a graph illustrating a functional relationship between the wavelength (cm$^{-1}$) of the incident IR radiation and the responsivity (amperes per watt of optical power) (A/W) for the experimental version of the device shown in FIG. 1 with a forward bias of seven volts and having the potential profile of FIG. 4.

FIG. 6 is a schematic conduction band potential profile illustrating the preferred embodiment of FIG. 1 under a reverse applied bias.

DETAILED DESCRIPTION OF THE PREFERRED EMBODIMENTS

Figure 1:
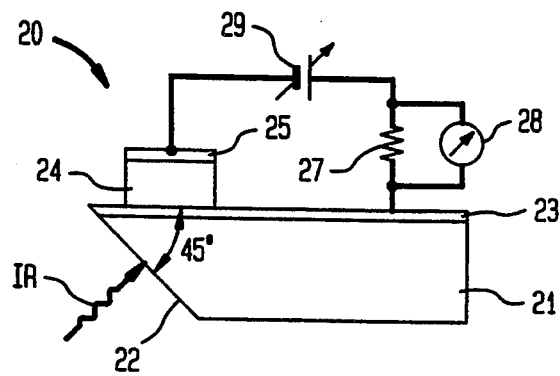
FIG. 1 is a schematic representation, greatly enlarged, of an IR detector in accordance with the present invention.

Referring now to the drawings, there is shown in FIG. 1 a photodetector 20 having a semi-insulating substrate 21 that is transparent to radiation. Substrate 21 has a polished face 22 that functions as an input for radiation to be detected such as IR radiation. Face 22 is preferably oriented at forty-five degrees as shown. Substrate 21 has a support surface on which a conductive contact layer 23 is deposited. Layer 23 is also transparent to radiation.

A semiconductor superlattice structure 24 is formed on layer 23. A second conductive contact layer 25 is deposited on the surface of structure 24. Layers 23, 25 are in contact with opposite parallel surfaces of structure 24. An adjustable voltage source 29 and a series resistor 27 are connected across semiconductor structure 24 via contact layers 23, 25. A voltmeter 28 is connected across resistor 27.

The operation of detector 20 as an IR detector is as follows: IR radiation incident on face 22 passes through substrate 21 and contact layer 23 and illuminates superlattice structure 24 at an angle. Structure 24 absorbs that portion of the IR radiation having frequencies that fall within the absorption bands of structure 24. This IR absorption causes a photocurrent to flow through structure 24 and resistor 27. The amount of current flow depends on the total amount of IR radiation absorbed by structure 24. As such, voltmeter 28, which measures current flow by measuring the voltage across resistor 27, provides a measure of the amount of radiation incident on detector 20 that lies within the absorption band of structure 24.

Figure 2:
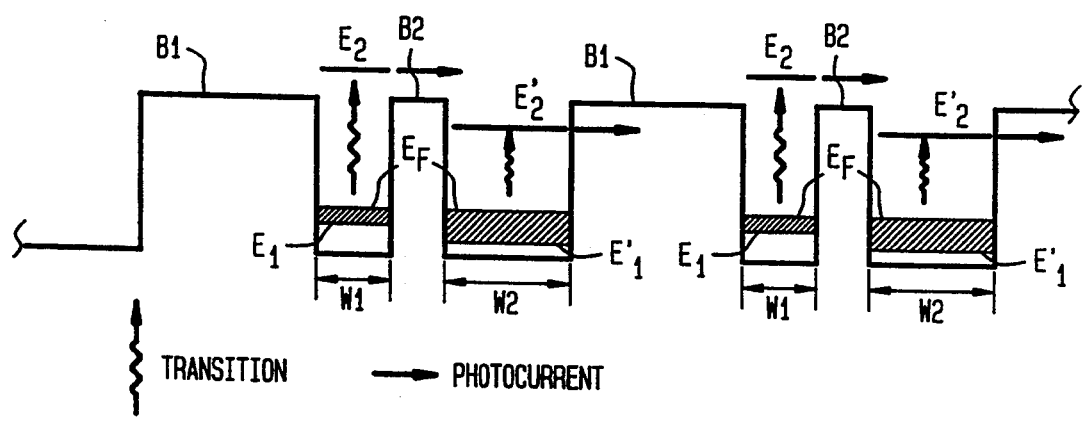
FIG. 2 is a schematic conduction band potential profile illustrating the preferred embodiment of FIG. 1 with no applied bias.

The absorption characteristics of superlattice structure 24 depends, among other things, on its quantum well structure. FIG. 2 illustrates the conduction band potential profile of a preferred well structure for a small portion of semiconductor structure 24. FIG. 2 illustrates a potential profile of detector 20 with voltage source 29 adjusted to zero bias.

The potential profile of FIG. 2 shows an array of doped quantum well units with each unit having two quantum wells of different widths W1 and W2 and two barriers B1 and B2. A typical detector 20 has fifty units while FIG. 2 shows only two of these units.

In general, a quantum well is created when a layer of smaller band-gap material is placed between two layers of greater band-gap material. Inside a quantum well, there are discrete energy levels due to size quantization. A quantum well acts like a "trap" to electrons.

In the present case, the quantum wells of widths W1 and W2 are formed by placing layers of the same smaller band-gap material between layers of the greater band-gap material used to form barriers B1 and B2. The smaller band-gap materials have thicknesses equal to widths W1 and W2. Barriers B2 are narrow and separate the quantum wells in each unit while barriers B1 are wider and are used to separate the units.

The discrete electron energy levels inside each quantum well, formed by size quantization, are labeled E1, E2, E1', E2'. Ef is the Fermi level which is dependent upon the doping density of the semiconductor layers. Electrons are supplied through doping of the smaller band-gap materials with certain impurities. As shown in FIG. 2, widths W1 and W2 of the quantum wells and the widths B1 and B2 of the quantum barriers are engineered such that at zero bias, the Fermi levels Ef across the two quantum wells are substantially equal, but the lower energy levels E1 and E1' are different. One way this is accomplished is by providing each well with the same dopant density while varying the width of the quantum wells (as shown in FIG. 2). Given this configuration, the electrons in the quantum wells will occupy the lower levels of the first allowed band starting with levels E1 and E1'. Because electrons prefer to reside in the lower energy levels, some electrons in the thinner wells, having width W1, will transfer to the thicker wells, having width W2, until the Fermi level Ef in the wells of the same unit are the same. Consequently, the Fermi level Ef, the topmost filled level, is at the same level in all wells of the same unit. The width of barrier B2 is sufficiently thin to permit electrons in the first allowed band to easily tunnel therethrough. On the other hand, the width of barrier B2 is sufficiently thick to prevent coupling between adjacent wells so that the energy level structure in each well is not disturbed by the presence of the other well. Further, barrier B1 is sufficiently thick so that the tunneling of electrons in the first allowed band is greatly impeded.

Even though all of the wells may contain the same dopant density, the number of electrons in each well are not the same. The reason for this is that the lower levels E1 and E1' are not at the same level while the Fermi level Ef is at the same level. The lower levels E1 and E1' are not at the same level because the well widths W1 and W2 are different resulting in a different size quantization for these wells. It is also for this reason that levels E2 are higher than levels E2'.

When exposed to infrared radiation, electrons located in the lower energy levels E1 and E1' absorb the incoming IR energy and undergo a transition to the higher levels E2 and E2', respectively. Once transitioned to levels E2 and E2', the electrons easily escape from the quantum wells and produce a photocurrent. As those skilled in the art will readily appreciate, not all of the incident radiation is absorbed by the electrons; only that radiation with photon energies equal to (E2—E1) and (E2'—E1') can be absorbed for the case shown in FIG. 2. The corresponding wavelengths $\lambda$ and $\lambda'$ are hc/(E2—E1) and hc/(E2'—E1'), respectively, where h is Plank's constant and c is the speed of light.

Consequently, for the FIG. 2 embodiment, the thicker well, having width W2, has a smaller energy spacing and its detecting wavelength $\lambda'$ will be longer. Further, the narrower well, having width W1, has a larger energy spacing and its detecting wavelength $\lambda$ will be shorter. Therefore given the above, one skilled in the art would be able to engineer each well to cover a particular wavelength by choosing appropriate well widths. Moreover, one skilled in the art would also be able to engineer various other means of maintaining substantially equal Fermi levels Ef while also generating different lower energy levels between the quantum wells. Such an alternate method would include varying the electron density of the wells by selecting various small bandgap semiconductor materials in combination with certain dopants while maintaining the same quantum well width.

Figure 3:
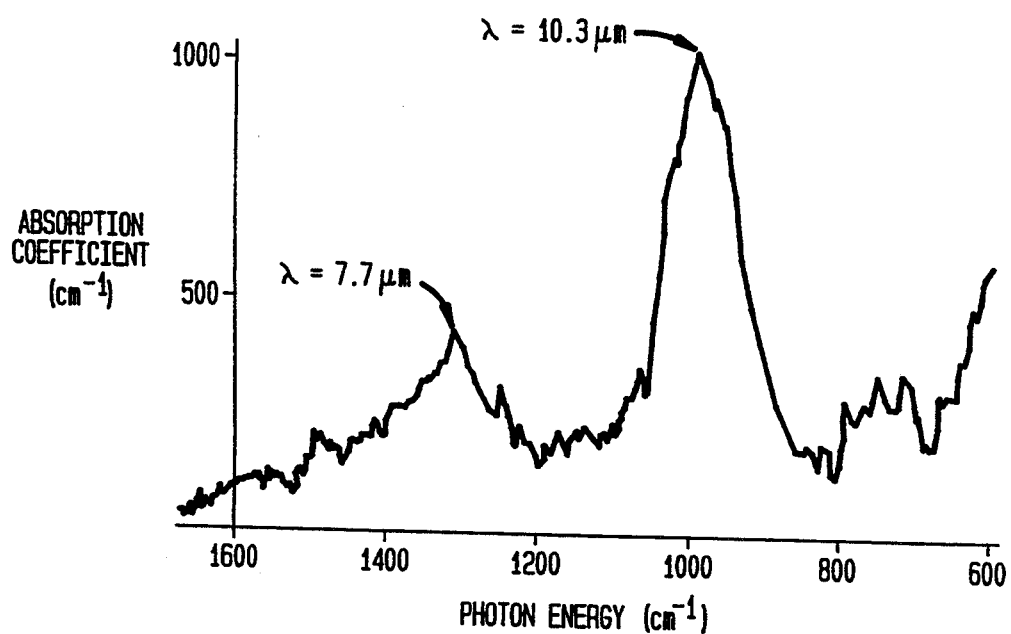
FIG. 3 is a graph illustrating a functional relationship of absorption coefficient ($cm^{-1}$) vs. photon energy in terms of wave number (cm$^{-1}$) for an experimental version of the device shown in FIG. 1 and having the potential profile of FIG. 2.

FIG. 3 shows the absorption coefficient of the preferred embodiment with fifty quantum well units in which width W1 is 50 Å, width W2 is 70 Å, barrier B1 is 40 Å thick and barrier B2 is 250 Å thick. The material of the wells is GaAs and the material of the barriers B1, B2 is $Al_{0.27}Ga_{0.73}As$. The material of contact layers 23, 25 is GaAs. The well material and the contact layer materials are doped to $1 \times 10^{18}$ cm$^{-3}$. FIG. 3 shows that for this experimental embodiment the absorption of the thinner well, having width W1, is peaked at $\lambda = 7.7$ $\mu$m and that of the thicker well, having width W2, is peaked at $\lambda' = 10.3$ $\mu$m. Since more electrons reside in the thicker wells, the absorption at its corresponding wavelength, 10.3 $\mu$m, is stronger. When a forward bias is applied to structure 24 by adjusting source 29, the potential profile of structure 24 changes from that of FIG. 2 to that of FIG. 4, which shows that lower level E1' in the thick well is further pulled down by the applied electric field. As a result, more electrons from the thinner well are transferred to the thicker well. At high biases, the thinner well is empty. As can be seen in FIG. 5, the experimental device described above is now sensitive only to radiation having wavelengths in the 10.3 $\mu$m range.

When the bias is reversed via voltage source 29, the potential profile of FIG. 6 results. As seen in FIG. 6, lower level E1 in the thinner well becomes lower than level E1' of the thicker well. In this case most of the electrons are located in the thinner well and detector 20 becomes sensitive only to radiation having wavelengths in the 7.7 $\mu$m range as shown in FIG. 7.

Figure 7:
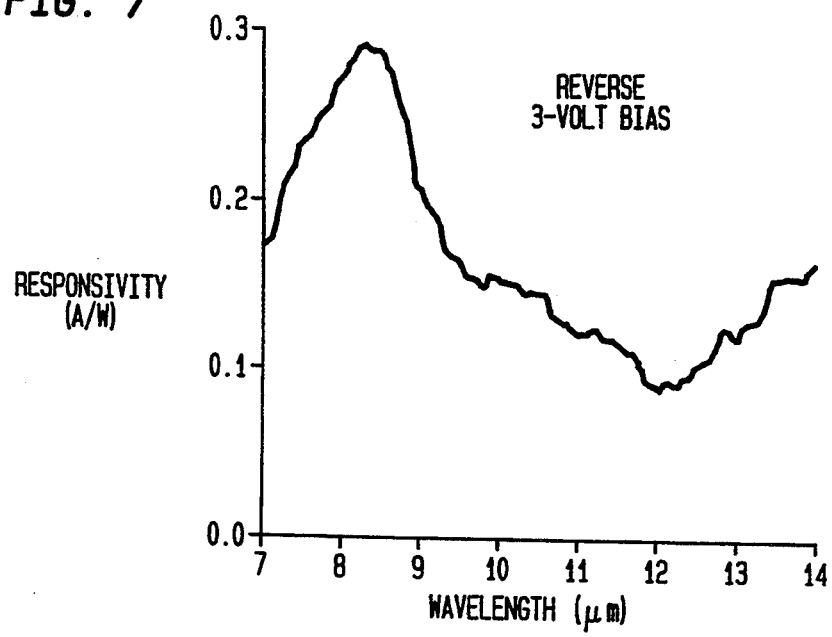
FIG. 7 is a graph, similar to the graph of FIG. 5, illustrating responsivity (cm$^{-1}$) vs. wavelength (cm$^{-1}$) for the experimental version of the device shown in FIG. 1 with a reverse bias of minus three volts and having the potential profile of FIG. 6.
Figure 8:
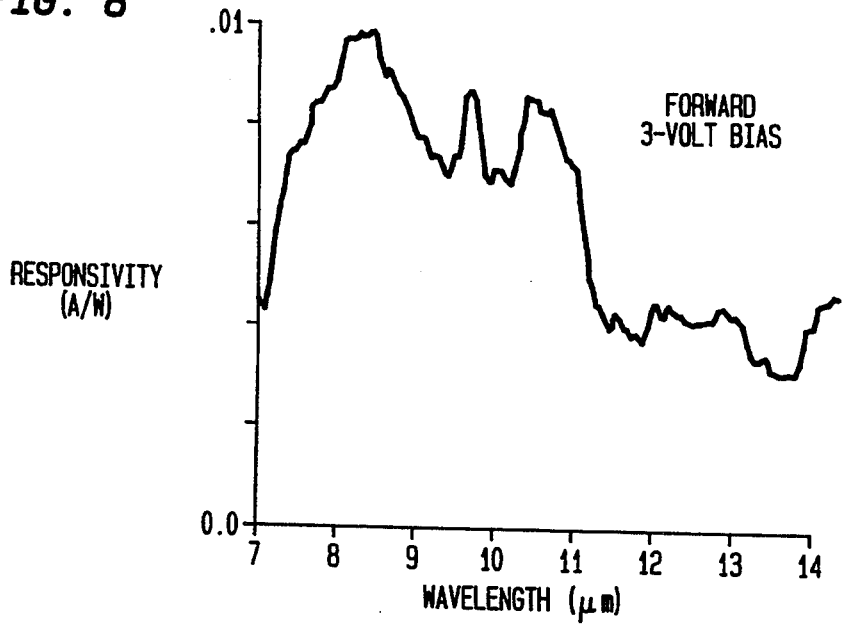
FIG. 8 is a graph, similar to the graph of FIG. 7, illustrating responsivity (cm$^{-1}$) vs. wavelength (cm$^{-1}$) for the experimental version of the device shown in FIG. 1 with a forward bias of three volts and having the potential profile of FIG. 4.

FIG. 8 depicts the detector response for a situation where voltage source 29 is adjusted to a forward bias of three volts, i.e. a bias value that is between the extremes of FIG. 4 (+7 volts) and FIG. 7 (-3 volts). In this case, the responsivity has two relatively low peaks in the wavelength regions of 7.7 $\mu$m and 10.3 $\mu$m.

Figure 9:
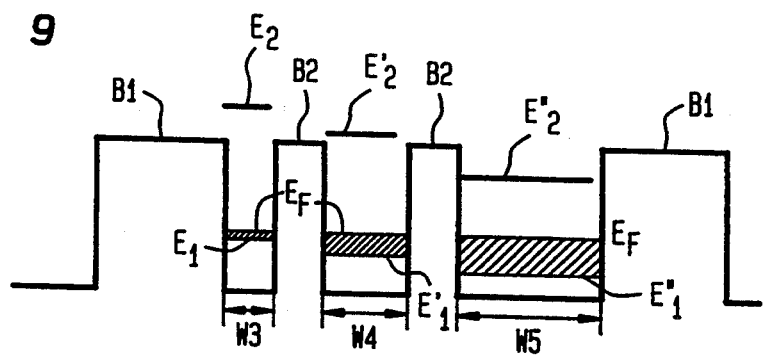
FIG. 9 is a schematic conduction band potential profile, similar to FIG. 2, illustrating an alternate embodiment of the invention with no applied bias.
Figure 10:
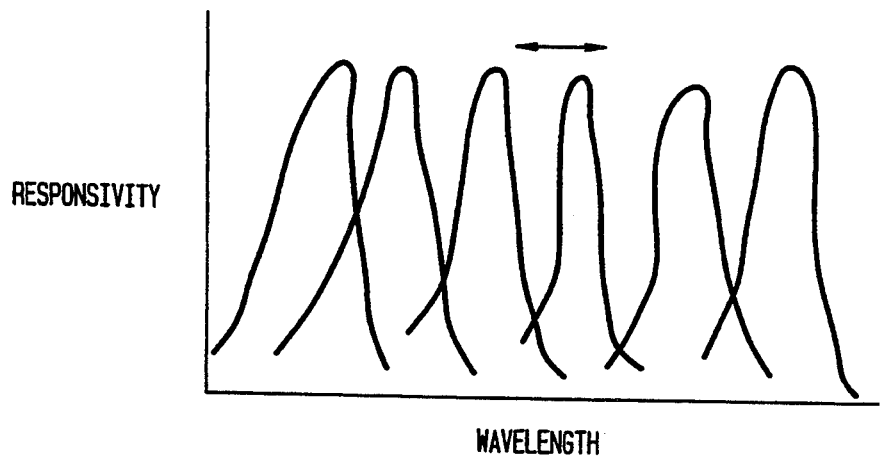
FIG. 10 is a graph illustrating responsivity (cm$^{-1}$) vs. wavelength (cm$^{-1}$) for the alternate embodiment under multiple biases.

Obviously, many modifications and variations of the preferred embodiment are possible in the light of the above teachings. For example, the potential profiles described above have only two quantum wells in each unit. As such, detector 20 functions as a two-color detector that can be switched between colors by adjusting the bias to appropriate values. However, each unit need not be limited to only two quantum wells. FIG. 9 shows a potential profile for a modification of detector 20 in which superlattice structure 24 has an array of quantum well units in which each unit has three quantum wells of different widths W3, W4, W5, wherein W3<W4<W5. Inside each unit, the three wells are separated by narrow barriers B2 of equal width. The units are separated by wider barriers B1. The third well has levels E"1, E"2. When the bias is changed gradually, via voltage source 29, the detection wavelength moves smoothly from one end of the spectrum to the other end with a multicolor detection capability, This situation is shown schematically in FIG. 10 in which a spaced plurality of responsivity peaks is used to depict the smooth motion of a single peak as it moves across the operating spectrum.

Figure 11:
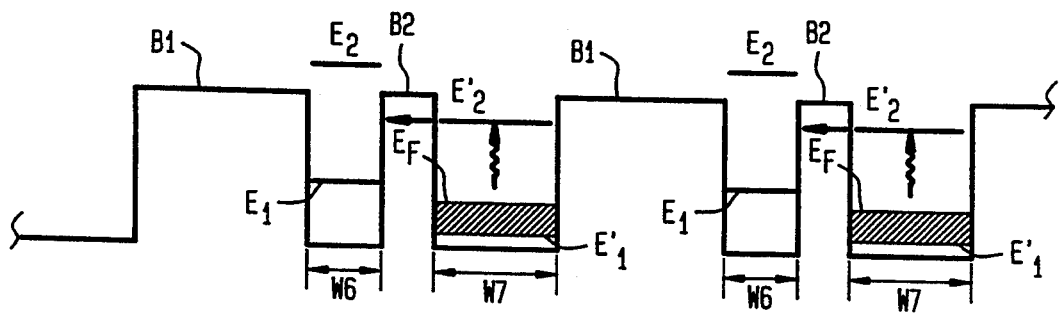
FIGS. 11 and 12 are schematic conduction band potential profiles illustrating an alternate embodiment of the invention.

FIG. 11 shows a potential profile of still another variation of superlattice structure 24. The FIG. 11 variation permits multicolor operation by simply adjusting a bias having a single polarity as opposed to switching a bias between opposite polarities as is the case in the FIG. 2 embodiment. The potential profile of FIG. 11 is similar to the profile of FIG. 2; the only difference is that the well widths W6, W7 are chosen such that under zero bias lower energy levels E1 of the doped narrow wells are empty. The reason for this is that energy levels E1 are higher than Fermi levels Ef at zero and low biases, causing the electrons from the thin wells to tunnel into the thick wells. Therefore, at low biases, IR radiation is absorbed only in the wide wells. As such, only radiation having a wavelength corresponding to the energy difference (E2'—E1') is detected.

Figure 12:
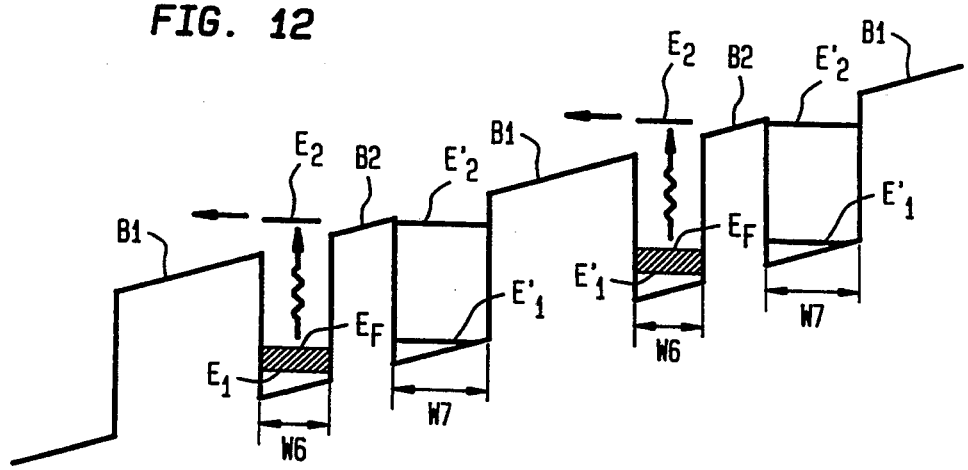
Figure 14:
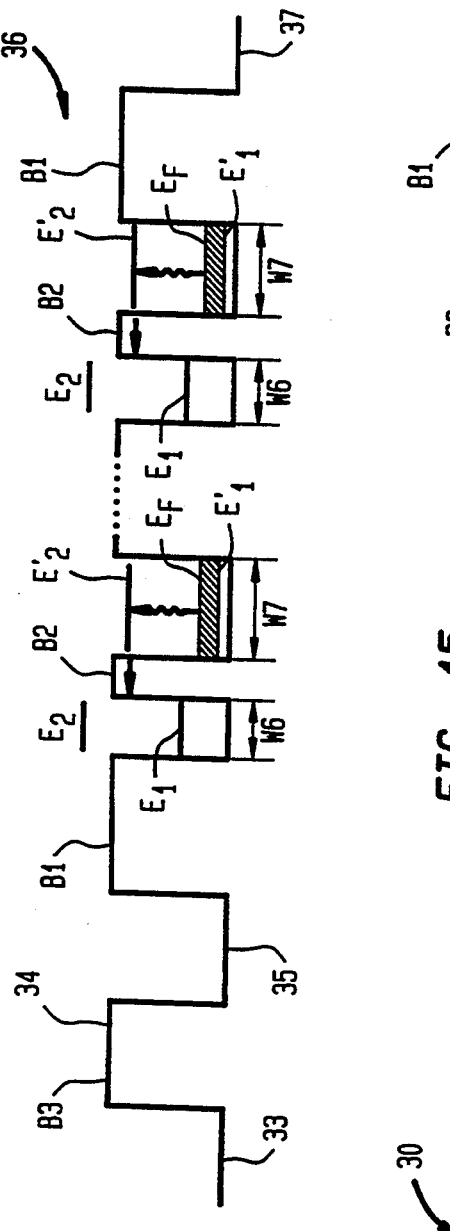
FIGS. 14 and 15 are schematic conduction band potential profiles for the embodiment of FIG. 13.
Figure 15:
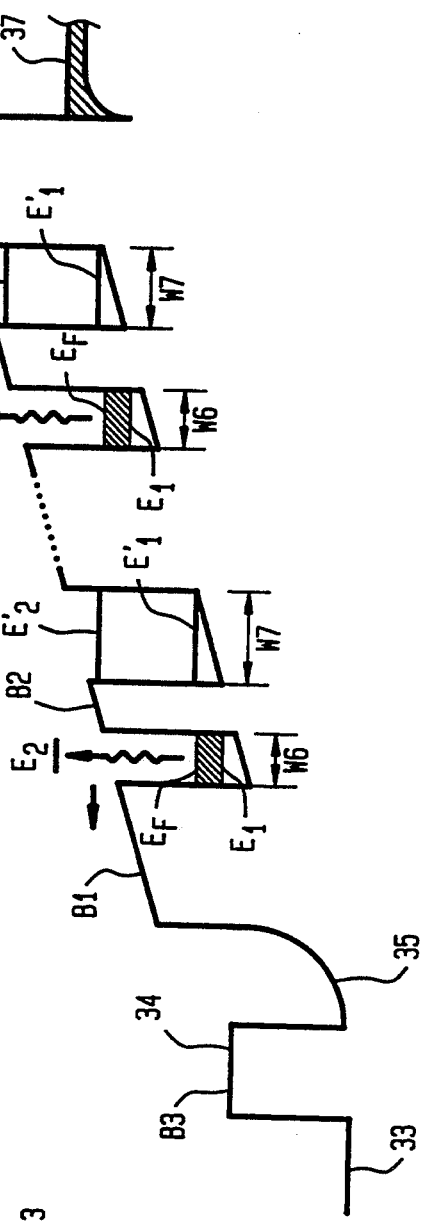
Figure 13:
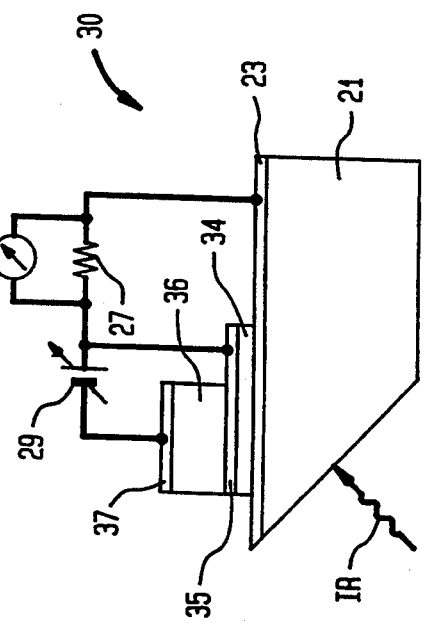
FIG. 13 is a schematic representation, greatly enlarged, of another alternate embodiment in which an IR detector device uses a hot-electron transistor.

FIG. 12 illustrates a potential profile for a situation in which the embodiment depicted in FIG. 11 is subjected to a relatively high bias such that the lower energy levels E1' of the wider wells, having width W7, are empty and the lower energy levels of the narrow wells, having width W6, are occupied. Consequently, IR radiation is absorbed only in the narrow wells under high biases. As such, only radiation having a wavelength corresponding to the energy difference (E2—E1) is detected, The variation of FIGS. 11 and 12 may be used to form a multicolor hot-electron transistor detector 30 as illustrated in FIGS. 13-15. A conventional IR hot-electron detection device is disclosed in my U.S. Pat. No. 5,031,013.

Detector 30 includes substrate 21 on which a collector contact 33 is deposited. An electron energy filter layer 34 is deposited on contact 33 to provide a relatively wide barrier B3 as shown in FIGS. 14, 15. Next a base contact 35 is placed on filter 34. A superlattice structure 36 of the type disclosed in FIGS. 11, 12 is placed on base contact 35. Finally, an emitter contact 37 is placed on superlattice structure 36. Superlattice structure 36 is biased by adjustable voltage source 29 through emitter contact 37 and base contact 35. Photocurrent is sensed by resistor 27 which is connected between collector contact 33 and voltage source 29.

Voltmeter 28 is connected across resistor 27 to provide a measure of the photocurrent.

In general, detector 30 is tuned for multicolor operation by adjusting the voltage source 29. IR radiation absorbed in the quantum wells of superlattice structure 36 produces a photocurrent which is amplified by a hot-electron transistor action as it flows through base contact 35, filter layer 34 and collector contact 33. Filter layer 34 filters out dark current that passes through structure 36. As such, detector 30 is potentially a more sensitive detector than is detector 20. Superlattice structure 36 of FIG. 13 functions in like manner to the device of FIGS. 11, 12. More specifically, with relatively low bias voltages applied to structure 36 by source 29, the narrow quantum wells, having width W6, remain empty (see FIG. 14). Also, the absorption of IR radiation in the wider wells, having width W7, create a photocurrent having energy E2'. This photocurrent has sufficient energy to pass barrier B3 of filter 34. However, dark currents, having energies lower than E2, are easily blocked by barrier B3. These dark currents are swept directly out of base contact 35 by voltage source 29. On the other hand, the photocurrent flows through filter layer 34, collector contact 33 and resistor 27 to voltage source 29. Voltmeter 28 provides a measure of the magnitude of the photocurrent passing through resistor 27 and, therefore, the amount of radiation absorbed in the wider wells of superlattice structure 36.

When relatively high bias voltages are applied to structure 36, electrons easily tunnel through narrow barriers B2 from the wider quantum wells, having width W7, into the narrower quantum wells, having width W6. Again, only the photocurrent produced by the absorption of IR radiation in the narrower wells have sufficient energy to pass barrier B3. This photocurrent flows from collector 33 to voltage source 29 via resistor 27. In this case, voltmeter 28 indicates the amount of absorbed IR radiation at the wavelength corresponding to the narrower wells. It should be understood, of course, that the foregoing disclosure relates to only preferred embodiments of the invention and that numerous other modifications or alterations may be made therein without departing from the spirit and the scope of the invention as set forth in the appended claims.

What is claimed is:

1. A semiconductor superlattice structure comprising:
   a plurality of doped semiconductor layers forming quantum well units, each said unit having at least two doped quantum wells therein, each said doped quantum well having a lower energy level, a higher energy level, and a Fermi level, wherein, at a zero bias, the Fermi levels of each of said doped quantum wells are substantially equal; wherein, at a predetermined bias, the Fermi levels of said doped quantum well units are different; and wherein the lower energy levels of each quantum well are different from one another;
   a set of first semiconductor layers forming quantum potential barriers each located between adjacent ones of said quantum well units, said first potential barriers substantially impeding the tunneling therethrough of electrons at said lower energy levels; and
   a set of second semiconductor layers forming quantum potential barriers each located between adjacent ones of said doped quantum wells in each of said quantum well units, said second potential barriers permitting electrons at said lower levels to tunnel therethrough and preventing energy-level coupling between adjacent ones of said doped quantum wells.

2. The structure of claim 1 wherein for each said unit the widths of said doped quantum wells are different from well to well and doped semiconductor layers have the same doping density.

3. The structure of claim 1 wherein the well widths are the same from unit to unit and the doped semiconductor layers have different bandgaps.

4. The structure of claim 1 wherein said first barriers have a common width and said second barriers have a common width and said first barriers are wider than said second barriers.

5. The structure of claim 4 wherein said barriers are made from a common material and said wells are made from a common material.

6. The structure of claim 5 wherein said units each have three doped quantum wells that are linearly spaced and have widths that increase from well to well.

7. A tunable radiation detector comprising:
   a semiconductor superlattice structure having a plurality of doped semiconductor layers forming quantum well units, each said unit having at least two doped quantum wells therein, each said doped quantum well having a lower energy level, a higher energy level, and a Fermi level, wherein, at a zero bias, the Fermi levels of each of said doped quantum wells are substantially equal; wherein, at a predetermined bias, the Fermi levels of said doped quantum well units are different; and wherein the lower energy levels of each quantum well are different from one another; a set of first semiconductor layers forming quantum potential barriers each located between adjacent ones of said quantum well units, said first potential barriers substantially impeding the tunneling therethrough of electrons at said lower energy levels; and a set of second semiconductor layers forming quantum potential barriers each located between adjacent ones of said doped quantum wells in each of said quantum well units, said second potential barriers permitting electrons at said lower levels to tunnel therethrough and preventing energy-level coupling between adjacent ones of said doped quantum wells;
   biasing circuit connected across said semiconductor superlattice structure; and
   photocurrent sensing means for measuring the amount of radiation absorbed by said semiconductor superlattice structure.

8. The structure of claim 7 wherein for each said unit the widths of said doped quantum wells are different from well to well and the doped semiconductors layers have the same doping density.

9. The structure of claim 7 wherein the well widths are the same from unit to unit and the doped semiconductor layers have different bandgaps.

10. The structure of claim 7 wherein said first barriers have a common width and said second barriers have a common width and said first barriers are wider than said second barriers.

11. The structure of claim 7 wherein said biasing circuit includes means for selectively permitting only a narrow band of radiation over a predetermined spectrum to be absorbed by said superlattice structure and causing photocurrent produced by the absorption to be sensed by said photocurrent sensing means, whereby said detector is tuneable for multicolor operation.

12. The structure of claim 11 wherein said biasing circuit includes an amplifier means for amplifying said photocurrent.

13. The structure of claim 12 wherein said amplifier means includes a transistor having base, collector and emitter contacts, and wherein said superlattice structure is mounted between said base and emitter contacts.

14. The structure of claim 13 wherein said biasing circuit is connected between said emitter and base contacts, said photocurrent sensing means is connected between said biasing circuit and said collector contact, and said amplifier means further includes a barrier means located between said collector to and base contacts for passing photocurrent and blocking dark currents.

15. The structure of claim 14 wherein said superlattice structure absorbs radiation substantially in the infrared spectrum.

* * * * *